US012696708B2

(12) United States Patent
Yin et al.

(10) Patent No.: US 12,696,708 B2
(45) Date of Patent: *Jul. 28, 2026

(54) APPARATUS FOR PROCESSING SUBSTRATES OR WAFERS

(71) Applicant: Taiwan Semiconductor Manufacturing Company, Ltd., Hsinchu (TW)

(72) Inventors: Li-Chao Yin, Hsinchu (TW); Yuling Chiu, Hsinchu (TW); Yu-Lung Yang, Taichung City (TW); Hung-Bin Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/584,828

(22) Filed: Feb. 22, 2024

(65) Prior Publication Data

US 2024/0249957 A1     Jul. 25, 2024

Related U.S. Application Data

(62) Division of application No. 15/906,689, filed on Feb. 27, 2018, now Pat. No. 11,948,810.

(Continued)

(51) Int. Cl.
H10P 72/00 (2026.01)
(52) U.S. Cl.
CPC ...... H10P 72/0402 (2026.01); H10P 72/0452 (2026.01); H10P 72/0454 (2026.01);
(Continued)

(58) Field of Classification Search
None
See application file for complete search history.

(56) References Cited

U.S. PATENT DOCUMENTS

| | | | |
|---|---|---|---|
| 5,286,296 A | 2/1994 | Sato et al. | |
| 11,948,810 B2 * | 4/2024 | Yin ..................... | H01L 21/6719 |

(Continued)

FOREIGN PATENT DOCUMENTS

| | | | |
|---|---|---|---|
| CN | 105580107 A | | 5/2016 |
| JP | 2016004834 A | * | 1/2016 |

(Continued)

OTHER PUBLICATIONS

Notice of Allowance issued in U.S. Appl. No. 15/906,689, dated Nov. 24, 2023.

(Continued)

*Primary Examiner* — Karla A Moore
(74) *Attorney, Agent, or Firm* — STUDEBAKER BRACKETT PLLC

(57) ABSTRACT

A vacuum apparatus includes process chambers, and a transfer chamber coupled to the process chambers. The transfer chamber includes one or more vacuum ports, thorough which a gas inside the transfer chamber is exhausted, and vent ports, from which a vent gas is supplied. The one or more vacuum ports and the vent ports are arranged such that air flows from at least one of the vent ports to the one or more vacuum ports are line-symmetric with respect to a center line of the transfer chamber.

20 Claims, 13 Drawing Sheets

Related U.S. Application Data

(60) Provisional application No. 62/586,580, filed on Nov. 15, 2017.

(52) U.S. Cl.
CPC ...... *H10P 72/0462* (2026.01); *H10P 72/0464* (2026.01); *H10P 72/0441* (2026.01); *H10P 72/0466* (2026.01)

(56)     References Cited

U.S. PATENT DOCUMENTS

| | | | | |
|---|---|---|---|---|
| 2007/0119393 | A1* | 5/2007 | Ashizawa | H10P 72/0464 123/25 M |
| 2009/0301392 | A1* | 12/2009 | Kobayashi | C23C 16/4401 118/50 |
| 2010/0236478 | A1* | 9/2010 | Miyashita | C23C 16/4401 118/719 |
| 2014/0262036 | A1 | 9/2014 | Reuter et al. | |
| 2014/0273489 | A1 | 9/2014 | Wang et al. | |
| 2014/0353149 | A1 | 12/2014 | Seino et al. | |
| 2015/0090341 | A1* | 4/2015 | Ng | H01L 21/00 137/583 |

| | | | | |
|---|---|---|---|---|
| 2016/0133491 | A1 | 5/2016 | Thirunavukarasu et al. | |
| 2016/0169766 | A1* | 6/2016 | Ishibashi | H01L 21/67098 414/217 |
| 2017/0356085 | A1* | 12/2017 | Morey | H01J 37/3244 |
| 2019/0096702 | A1* | 3/2019 | Sakai | C23C 16/45519 |

FOREIGN PATENT DOCUMENTS

| | | | | | |
|---|---|---|---|---|---|
| JP | 2019062091 | A | 4/2019 | | |
| KR | 1992-0015476 | A | 8/1992 | | |
| KR | 10-2004-0013965 | A | 2/2004 | | |
| KR | 10-2014-0129279 | A | 11/2014 | | |
| KR | 10-2016-0038949 | A | 4/2016 | | |
| KR | 20160038949 | A | * | 4/2016 | ....... H01L 21/67745 |
| KR | 10-2016-0067212 | A | 6/2016 | | |
| TW | 200530105 | A | 9/2005 | | |
| TW | I294155 | B | 3/2008 | | |

OTHER PUBLICATIONS

Non-Final Office Action issued in U.S. Appl. No. 15/906,689, dated Sep. 18, 2020.

* cited by examiner

APPARATUS FOR PROCESSING SUBSTRATES OR WAFERS

CROSS-REFERENCE TO RELATED APPLICATIONS

The application is a divisional application of U.S. application Ser. No. 15/906,689, filed Feb. 27, 2018, now U.S. Pat. No. 11,948,810, which claims priority to U.S. Provisional Patent Application 62/586,580, filed Nov. 15, 2017, the entire disclosure of each of which is incorporated herein by reference.

TECHNICAL FIELD

The present disclosure relates to a vacuum apparatus, more particularly, to a vacuum apparatus for processing wafers or substrates.

BACKGROUND

A semiconductor manufacturing process or a flat panel display device (e.g., liquid crystal display) requires various vacuum processing such as a film deposition process and an etching process. During vacuum processing, undesired byproducts are generated and become particles which reduce yield of semiconductor devices or flat panel devices. Thus, controlling particles caused from the byproducts is one of the issues to be solved in the semiconductor device manufacturing operations and/or the flat panel display manufacturing operations.

DETAILED DESCRIPTION

Figure 1:
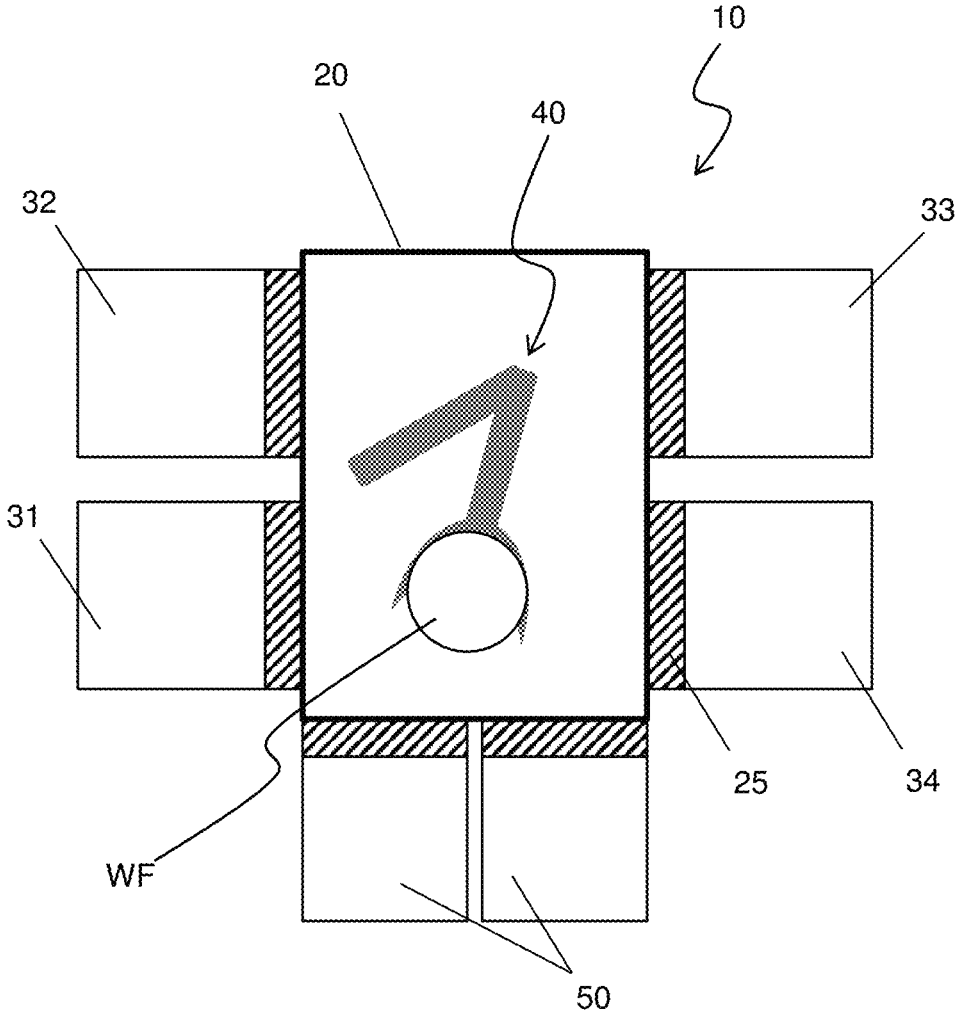
FIG. 1 is a schematic view of a vacuum processing apparatus according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described.

A vacuum processing apparatus used in semiconductor device manufacturing operations and/or flat panel display manufacturing operations include, for example, a plasma processing chamber, such as a plasma dry etching chamber or a photo resist ashing chamber; a film deposition chamber, such as a chemical vapor deposition (CVD) process chamber, an epitaxial growth chamber, a sputtering chamber, an atomic layer deposition (ALD) chamber or a physical vapor deposition (PVD) chamber; a thermal operation chamber, such as an annealing chamber or a oxidation chamber. During semiconductor wafer or glass substrate processing within these vacuum processing chambers, films and/or byproducts caused by etching operations or film formation operation are deposited on inner walls of the vacuum processing chamber. Further, a vacuum processing apparatus includes a non-processing chamber, such as a chamber for measuring physical, chemical and/or electrical property of the pre-processed and/or post-processed wafer or substrate. In addition, the vacuum processing apparatus includes one or more load lock chambers and one or more transfer chambers that connect the one or more load lock chambers and the processing chambers.

A vacuum processing chamber generally includes one or more vacuum ports which are connected to a pumping system including one or more vacuum pumps. The vacuum apparatus also includes one or more vent ports to introduce a gas or air when opening the vacuum apparatus or when increasing an inside pressure. When reducing the pressure and/or increasing the pressure inside the vacuum processing chamber, air or gas flows are generated inside the vacuum processing chamber. Such air or gas flows may blow up the films or the byproduct deposited on inner walls of the vacuum processing chamber and/or may locally pile up the films or the byproducts inside the vacuum processing chamber.

In the present disclosure, by adjusting the arrangement of vent ports and vacuum ports inside vacuum chambers, air or gas flows inside the vacuum chambers are controlled.

Figure 2:
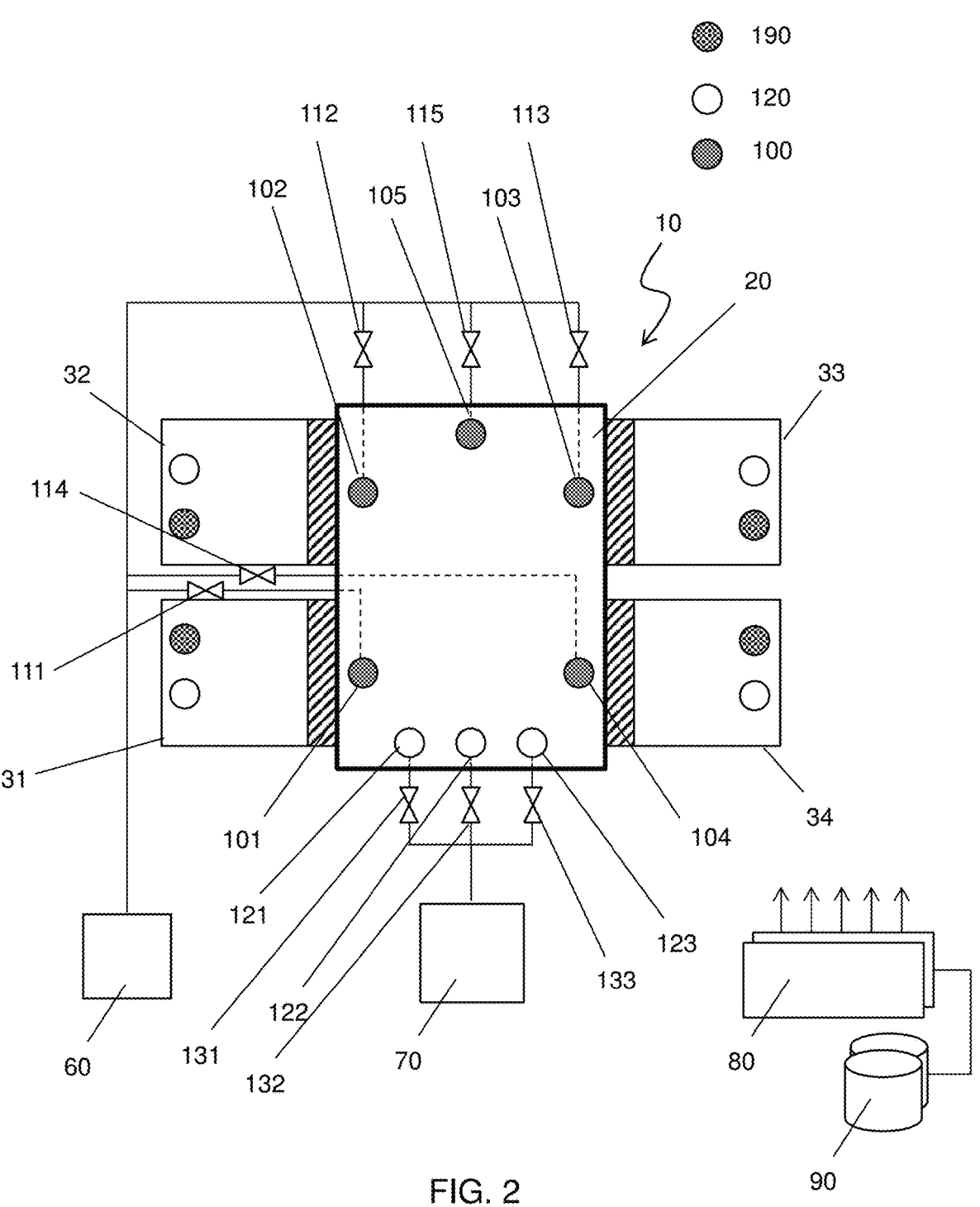
FIG. 2 is a schematic view of a vacuum processing apparatus according to an embodiment of the present disclosure.

FIGS. 1 and 2 show a schematic view of a vacuum processing apparatus according to an embodiment of the present disclosure. FIGS. 1 and 2 show only elements necessary to explain the features of the present embodiments, and it should be understood that one or more additional features not expressly shown in FIGS. 1 and 2 are included in the vacuum processing apparatus.

The vacuum processing apparatus 10 as shown in FIG. 1 includes a transfer chamber 20 to which vacuum processing or measurement chambers 31, 32, 33 and 34 are connected via a gate valve 25, respectively. The vacuum processing or measurement chambers 31, 32, 33 and 34 are one or more of a plasma processing chamber, such as a plasma dry etching chamber or a photo resist ashing chamber; a film deposition chamber, such as a CVD process chamber, an epitaxial growth chamber, a sputtering chamber, an ALD chamber or a PVD chamber; a thermal operation chamber, such as an annealing chamber or an oxidation chamber, or any other vacuum chambers. In some embodiments, all the vacuum processing or measurement chambers 31, 32, 33 and 34 are the same type of chambers (e.g., the same type of processing chambers), and in other embodiments, at least one of the vacuum processing or measurement chambers 31, 32, 33 and 34 is a different type of vacuum chamber. The processing or processes in the present disclosure may include measurement operations. Thus, in the followings, the vacuum processing or measurement chamber may be simply referred to as a vacuum processing chamber.

Further, one or more load lock chambers 50 are also connected to the transfer chamber 20 via a gate valve 25, respectively. Inside the transfer chamber, a substrate handling and transferring mechanism 40 (e.g., a wafer handler) having one or more movable arms is disposed. A semiconductor wafer WF or a glass substrate for a flat panel display is transferred from one chamber to another chamber by the substrate handling and transferring mechanism 40. In FIG. 1, four vacuum processing or measurement chambers 31, 32, 33 and 34 and two load lock chambers 50 are connected to the transfer chamber 20, but the numbers of chambers are not limited to. Further, in some embodiments, two or more transfer chambers connected via gate valves, respectively, are used in the vacuum processing apparatus 10.

FIG. 2 is a schematic view of a vacuum processing apparatus illustrating a vacuum system and a vent system according to an embodiment of the present disclosure.

In the transfer chamber 20, one or more vent ports 100 and one or more vacuum ports 120 are disposed. The vent ports 100 are used to introduce a vent gas, such as $N_2$ or air, into the transfer chamber, and the vacuum ports 120 are used to evacuate the transfer chamber. The gas is not limited to a vent gas and may be a process gas.

More specifically, the transfer chamber 20 includes five vent ports 101, 102, 103, 104 and 105, and three vacuum ports 121, 122 and 123 in some embodiments. Each of the vent ports 101, 102, 103, 104 and 105 is fluid communicably connected to a vent gas supply source 60 via gas channels on which one or more valves 111, 112, 113, 114 and 115 are disposed, respectively in some embodiments. The vent gas supply source 60 is a gas bomb or a gas tank storing pressurized vent gas such as $N_2$ or air, or a facility gas supply system.

Each of the vacuum ports 111, 112 and 113 is fluid communicably connected to a pumping system 70 via gas channels on which one or more valves 131, 132 and 133 are disposed, respectively, in some embodiments. The pumping system 70 includes one or more dry pumps, such as a turbo molecular pump (TMP), a sorption pump, a sputter ion pump, a mechanical booster pump or a cryo pump. The valves 111-115 and 131-132 are respectively one of an open-close valve and a flow-amount controllable valve.

Further, one or more process gas ports 190 are provided inside the vacuum processing or measurement chambers 31, 32, 33 and 34. Further, one or more vacuum ports are provided inside each of the vacuum processing or measurement chambers 31, 32, 33 and 34, which are connected to the pumping system 70, respectively. In some embodiments, the pumping system is provided for the vacuum processing or measurement chambers separately from those for the transfer chamber 20. In some embodiments, the vent port connected to the vent gas supply 60 is not provided inside the vacuum processing or measurement chambers, and in other embodiments, one or more vent ports are provided inside the vacuum processing or measurement chambers.

At least a part of the operations of the vacuum processing apparatus 10 is controlled by one or more controllers 80 connected to or including one or more storages 90. The controller 80 is a computer system including one or more processors and the storage 90 stores control program, in some embodiments. When the control program is executed by the processor, the controller 80 controls operations of, for example, the substrate handling and transferring mechanism 40, the load lock chambers 50, gate valves 25, the valves 111-115 for the vent ports 101-105, valves 131-133 for the vacuum ports 121-123, a pumping system 70 and each process or measurement chambers 31-34. In some embodiments, the controller 80 controls the valves the valves 111-115 for the vent ports 101-105 and/or valves 131-133 for the vacuum ports 121-123 individually.

Figure 3:
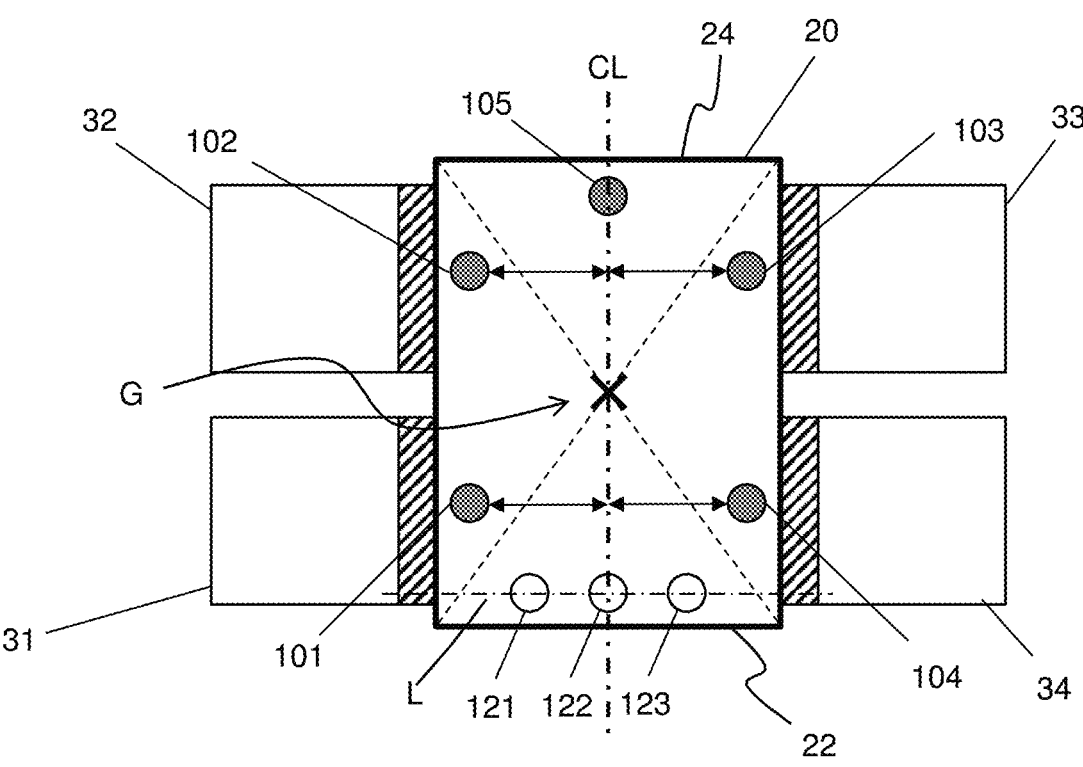
FIG. 3 is a schematic view of a vent/vacuum port arrangement according to an embodiment of the present disclosure.

FIG. 3 is a schematic view of a vent/vacuum port arrangement inside the transfer chamber 20 shown in FIGS. 1 and 2 according to an embodiment of the present disclosure.

As shown in FIG. 3, at least one of the vacuum ports 121-123 and at least one of the vent ports 101-105 are line-symmetrically arranged inside the transfer chamber 20 with respect to the center line CL of the transfer chamber 20. The center line CL passes through the geometric center G of the transfer chamber 20 when viewed from the above. The geometric center G can be the crossing point of the diagonal lines of the shape of a bottom base plate of the transfer chamber 20 in some embodiments in some embodiments. If the diagonal lines do not cross at the one point and form a polygon, the geometric center G is the center of gravity of the polygon in some embodiments. If the shape of a bottom base plate of the transfer chamber 20 is a triangle, the geometric center G is the center of the triangle. The center line CL also passes one of the side walls 22 constituting the transfer chamber 20. More specifically, the center line CL is perpendicular to the one of the side walls 22.

In FIG. 3, the vent port 105 and the vacuum ports 121-123 are line-symmetrically arranged with respect to the center line CL inside the transfer chamber 20. Also, the vent ports 101-104 are line-symmetrically arranged with respect to the center line CL inside the transfer chamber 20. Further, all of the vacuum ports 121-123 and vent ports 101-105 are line-symmetrically arranged inside the transfer chamber 20 with respect to the center line CL.

In addition, as shown in FIG. 3, at least one vent port is provided in the transfer chamber 20 in front of each of the process chambers. For example, the vent port 101 is located in front of the gate valve of the process chamber 31, the vent port 102 is located in front of the gate valve of the process chamber 32, the vent port 103 is located in front of the gate valve of the process chamber 33, and the vent port 104 is located in front of the gate valve of the process chamber 34, respectively. The process chambers 31-34 are also line-symmetrically arranged with respect to the center line CL, and thus the vent ports 101-104 are line-symmetrically arranged inside the transfer chamber 20 with respect to the center line CL. A distance between the gate valve of each of the process chambers 31-34 and the corresponding vent port is in a range from about 0.5 mm to about 5 cm in plan view in some embodiments.

As shown in FIG. 3, while individual vent ports 101-104 are provided for respective process chambers 31-34, one or more common vent ports 105 are provided inside the transfer chamber 20, in some embodiments. At least one common vent port is provided on the center line CL of the transfer chamber 20 in some embodiments. When two or more common vent ports are provided, the common vent ports are line-symmetrically arranged with respect to the center line CL.

Similarly, at least one vacuum port is provided in the transfer chamber 20. At least one vacuum port (e.g., 122) is provided on the center line CL of the transfer chamber 20 in some embodiments. When two or more vacuum ports are provided, the vacuum ports are line-symmetrically arranged with respect to the center line CL. Further, as shown in FIG. 3, at least one of the vacuum ports is provided in the transfer chamber 20 in front of the load lock chamber 50, in some embodiments. In such a case, the vacuum port(s) is located closer to the load lock chamber than the vent ports in some embodiments. In other embodiments, the common vent port is located closer to the load lock chamber than the vacuum ports and the vacuum ports are arranged in front of opposite one 24 of the side walls. Further, in some embodiments, the vacuum ports are provided inside the transfer chamber 20 such that the vacuum ports are arranged on a line L parallel to one of side walls (e.g., 22) of the transfer chamber 20 as shown in FIG. 3.

Figure 4:
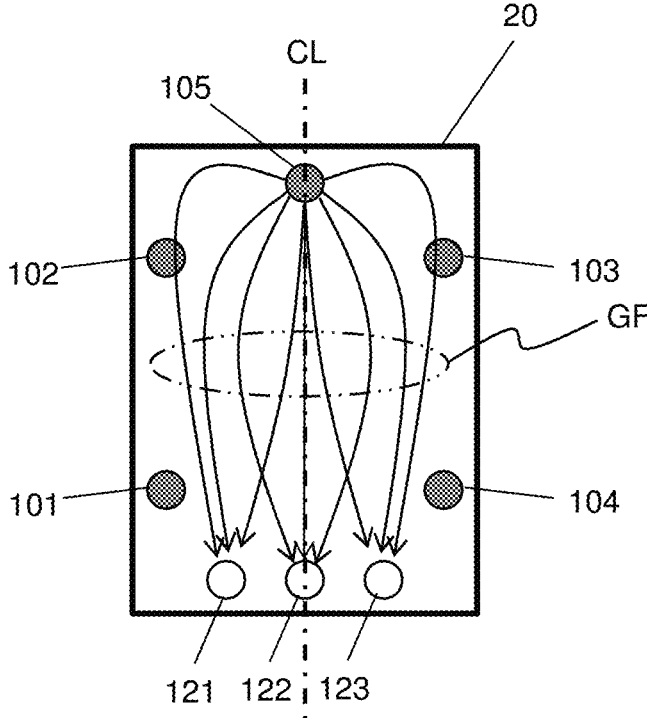
FIG. 4 is a schematic view of gas flows according to an embodiment of the present disclosure.

FIG. 4 is a schematic view of gas flows inside the transfer chamber 20 of the vacuum processing apparatus 10 shown in FIGS. 1-3 according to an embodiment of the present disclosure.

The vacuum processing apparatus 10 operates in various operation modes or conditions. For example, in an idle condition, no semiconductor wafer or substrate is loaded inside the vacuum processing apparatus 10. In a processing condition/mode, one or more wafers or substrates are transferred from the load lock chamber 50 to one or more of the process or measurement chambers 31-34 by the substrate handling and transferring mechanism 40 inside the transfer chamber, and the wafers or the substrates are processed at the processing or measurement chambers.

In the idle condition, all the gate valves are closed and a vent gas is introduced into the transfer chamber with vacuum pumping to purge the inside of the transfer chamber. The purge operation may be performed at another operation condition. In some embodiments, to purge the inside of the transfer chamber 20, the valve 112 for the common vent port 105 and the valves 131-133 for the vacuum ports 121-123 are opened by the operation of the controller 80. As set forth above, the common vent port 105 and the vacuum ports 121-123 are line-symmetrically arranged with respect to the center line CL, gas flows GF from the common vent port 105 to the vacuum ports are line-symmetric with respect to the center line CL of the transfer chamber 20, as shown in FIG. 4.

As set forth above, films or byproducts are generated in the processing chambers 31-34 and when the gate valve 25 is opened to transfer the wafer or substrate from/to the processing chamber, the films or the byproducts move from the processing chamber to the transfer chamber. When the gas flows are not symmetric, which may be caused by, for example, opening the valve for the vent port 101 and the valve for the vacuum port 122, a dead space is generated at the corner of the transfer chamber near the vent ports 105 and 103. When the dead space is generated, the films or byproducts are not purged by the purge gas flow and tend to locally deposited in the dead space. Such locally deposited film or byproducts may be blown or stirred up by movement of the wafer handling and transferring mechanism or by other air movement inside the transfer chamber, and may fall on the wafer or substrate.

In contrast, when the gas flows GF are symmetric as shown in FIG. 4, it is possible to minimize the generation of a dead space during the purge operation and thus to prevent the films or byproducts from being locally deposited. Accordingly, it is possible to improve the yield of the processed wafer or substrate and to reduce a maintenance cycle of the vacuum processing apparatus 10.

In FIG. 4, only the common vent port 105 is opened among the vent ports. In other embodiments, the vent ports 102 and 103 are opened together with or instead of the common vent port 105 during the purge operation. In such a case, the gas flows are also symmetric with respect to the center line CL. In other embodiments, all the vent ports 101-105 are opened.

In the present disclosure, the line-symmetric arrangement of the vent ports and/or the vacuum ports does not necessarily require mathematical accuracy. The positions of the vent ports and/or the vacuum port can deviate from the exact line-symmetric positions as long as the substantially symmetric gas flows can be obtained. For example, the deviation of the position from the exact positions can be 0 to about 2 cm in some embodiments.

Figure 5:
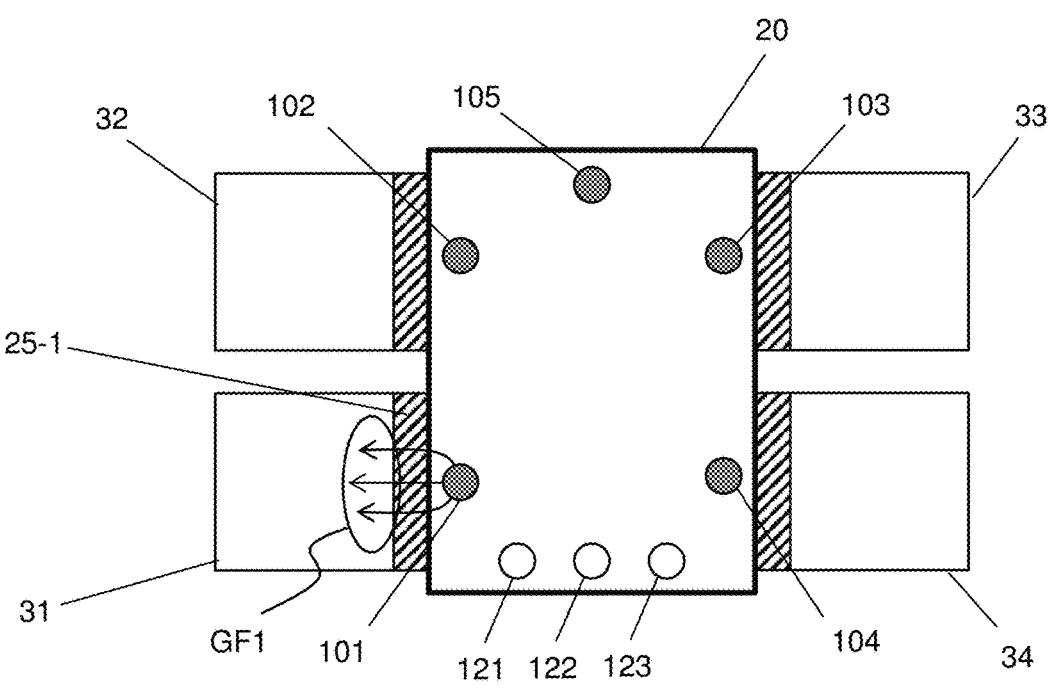
FIG. 5 is a schematic view of gas flows according to an embodiment of the present disclosure.
Figure 6:
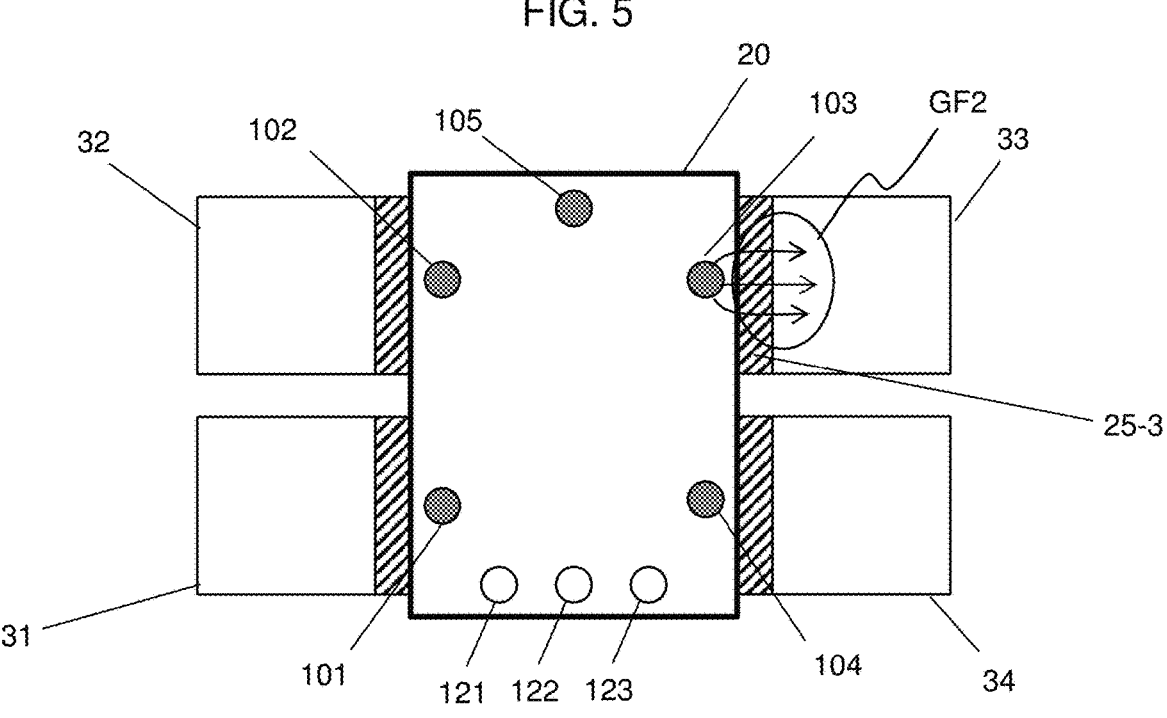
FIG. 6 is a schematic view of gas flows according to an embodiment of the present disclosure.

FIGS. 5 and 6 are schematic views of gas flows when the gate valve is opened to transfer the semiconductor wafer or the substrate from/to the processing chamber according to an embodiment of the present disclosure.

When a wafer or a substrate is transferred from or to the processing chamber 31-34 to or from the transfer chamber 20, the pressure inside the processing chamber is lower than the pressure inside the transfer chamber, in some embodiments. In other embodiments, as set forth above, no vent port for supplying a vent gas (e.g., $N_2$) is provided inside the vacuum processing or measurement chambers. In such cases, to purge the vacuum processing or measurement chambers, a vent gas is supplied from one of the vent ports in the transfer chamber to the vacuum processing or measurement chamber. In some embodiments, the valve for the vent port is opened and then the gate valve is opened. The timing of opening the gate valve and opening valve for a vent port is not particularly limited.

In the present embodiments, to purge a specific processing chamber, only the valve for the corresponding vent port located in front of (and closest to) the specific processing chamber is opened as shown in FIGS. 5 and 6. For example, as shown in FIG. 5, when the gate valve 25 for the processing chamber 31 is opened, the valve 111 (see, FIG. 2) is opened to introduce the vent gas from the vent port 101 into the processing chamber 31 to minimize the gas flows GF1, while other vent valves are closed. The valves for the vacuum ports 121-123 inside the transfer chamber are also closed in some embodiments. Similarly, in FIG. 6, when the gate valve 25 for the processing chamber 33 is opened, the valve 113 (see, FIG. 2) is opened to introduce the vent gas from the vent port 103 into the processing chamber 33 to minimize the gas flows GF2, while other vent valves are closed.

When vent ports 101-104 provided, respectfully, to the corresponding processing chambers 31-34 are not provided and only the common vent port 105 is provided, gas flow travel distances for the processing chambers 31-14 are different from each other (e.g., at least different between the processing chamber 31 and processing chamber 32. Different lengths of gas flow travel paths may cause various problems in the purge operation. For example, a purge operation for the processing chamber 31 may be insufficient compared with a purge operation for the processing chamber 32 when only the common vent port 105 is used, or the longer gas flow traveling path may cause more particles thrown up by the gas flows. Although it may be possible to place the common vent port at the position having an equal distance from the processing chambers, the gas flow traveling paths are generally long and due to the wafer handling and transferring mechanism located at the center of the transfer chamber, the gas flows may be disturbed causing non-uniform gas flows.

In contrast, by providing individual vent ports for the processing chamber, respectively, it is possible to minimize the gas flow traveling paths and to equalize the gas flow traveling paths from the vent port to the processing chamber. Accordingly, it is possible to prevent undesired particles thrown up by the gas flows, and to more effectively purge individual processing chambers.

FIGS. 7-16 are schematic views of a vent/vacuum port arrangement and/or the configuration of transfer chambers according to various embodiments of the present disclosure. One or more features of two or more following embodiments can be combined with one or more following embodiments. Configurations, element, features, materials and/or dimensions the same as or similar to those for FIGS. 1-6 may be employed in the following embodiments, and the detailed explanations may be omitted. Further, one or more features of the forgoing embodiments can be combined with one or more following embodiments.

Figure 7:
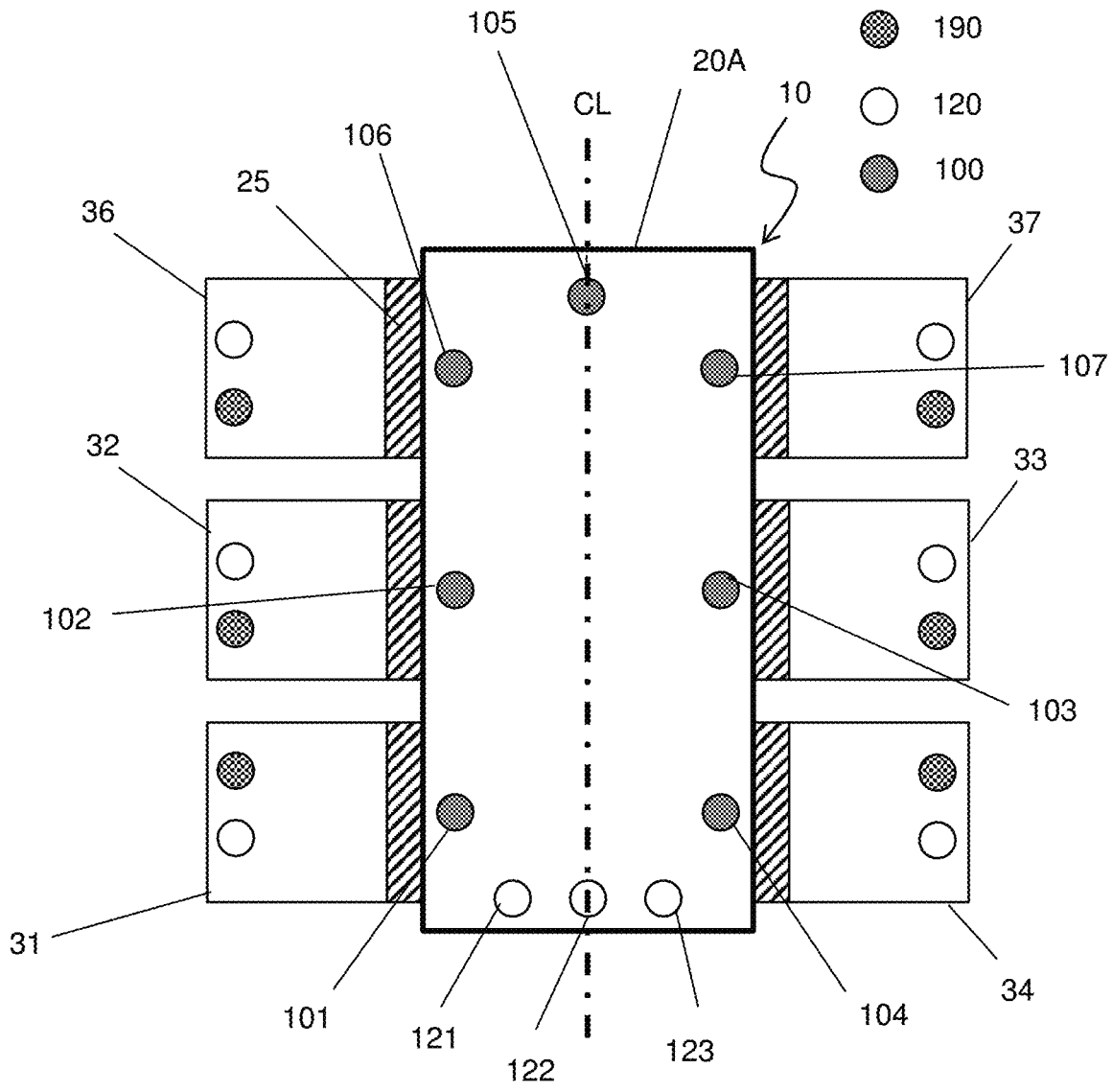
FIG. 7 is a schematic view of a vent/vacuum port arrangement according to another embodiment of the present disclosure.

FIG. 7 is a schematic view of a vent/vacuum port arrangement according to another embodiment of the present disclosure. As shown in FIG. 7, six (6) vacuum processing or measurement chambers 31-34 and 36-37 are connected via gate valves, respectively, to a transfer chamber 20A having a rectangular shape. The additional vacuum processing or measurement chambers 36 and 37 are the same type as the vacuum processing or measurement chambers 31-34 in some embodiments, and different types in other embodiments. Further, as shown in FIG. 7, additional vent ports 106 and 107 are provided in front of the vacuum processing or measurement chambers 36 and 37, respectively. The vent ports 101-107 are line-symmetrically arranged inside the transfer chamber 20A with respect to the center line CL.

Figures 8, 9:
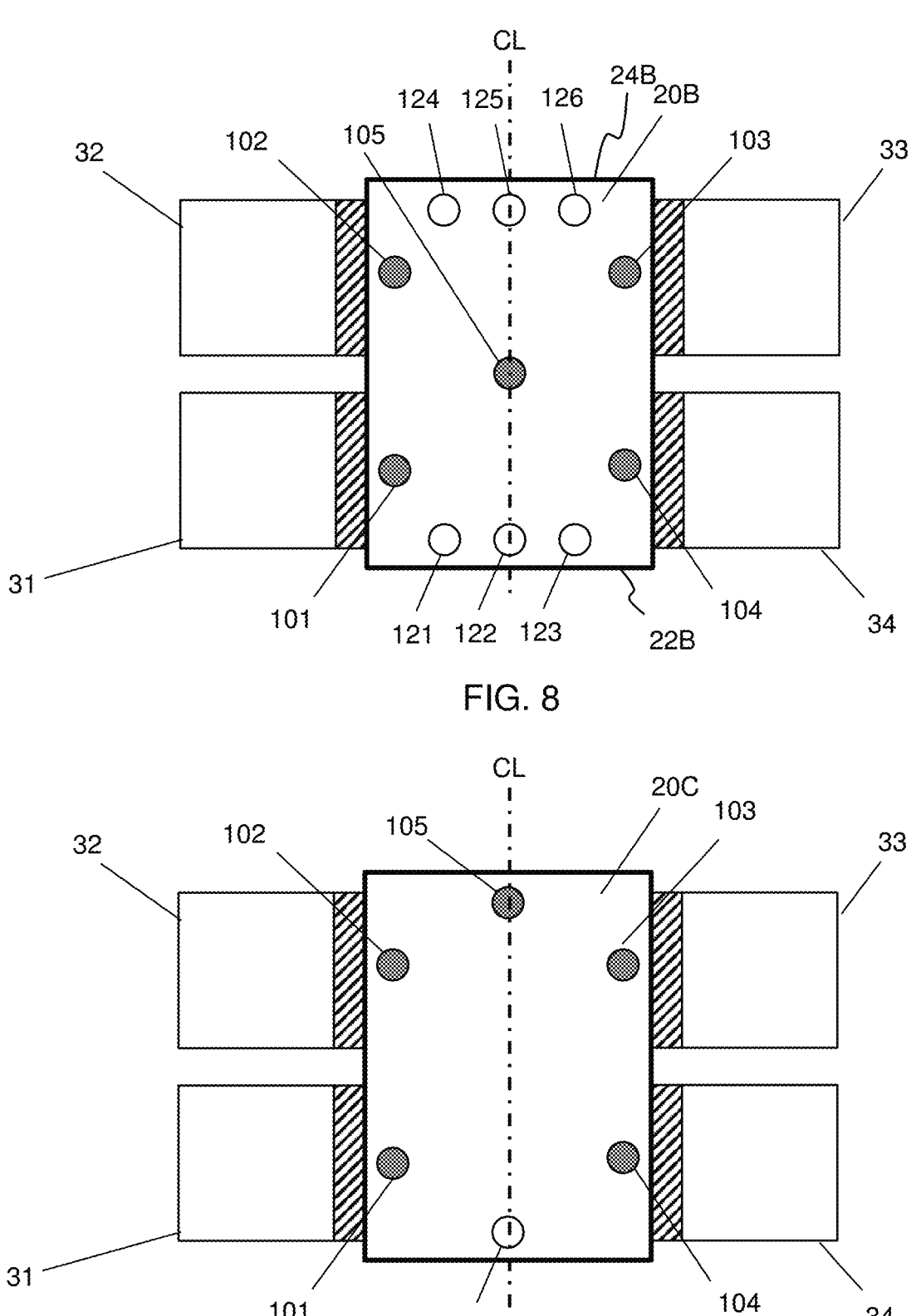
FIG. 8 is a schematic view of a vent/vacuum port arrangement according to another embodiment of the present disclosure.
FIG. 9 is a schematic view of a vent/vacuum port arrangement according to another embodiment of the present disclosure.

FIG. 8 is a schematic view of a vent/vacuum port arrangement according to another embodiment of the present disclosure. In FIG. 8, similar to FIGS. 1-6, four vacuum processing or measurement chambers 31-34 are provided to the transfer chamber 20B. The transfer chamber 20B includes two pairs of three vacuum ports and five vent ports as shown in FIG. 8. The vacuum ports 121-123 are provided at positions close to the side wall 22B and the vacuum ports 124-126 are provided at positions closer to the opposing side wall 24B. In some embodiments, the vacuum ports in each set are arranged on a line parallel to the respective side walls (e.g., 22B or 24B) of the transfer chamber 20B. The vent ports 101-104 are provided to the corresponding vacuum processing or measurement chambers 31-34, respectively, similar to FIGS. 1-6. In some embodiments, the common vent port 105 is provided at or near the geometric center of the transfer chamber 20B. The vent ports 101-105 are line-symmetrically arranged inside the transfer chamber 20B with respect to the center line CL, and the vacuum ports 121-126 are also line-symmetrically arranged inside the transfer chamber 20B with respect to the center line CL.

FIG. 9 is a schematic view of a vent/vacuum port arrangement according to another embodiment of the present disclosure. In FIG. 9, similar to FIGS. 1-6, four vacuum processing or measurement chambers 31-34 are provided to the transfer chamber 20C. The transfer chamber 20C includes only one vacuum port 122. The configuration of the vent ports 101-105 are the same as the configuration of vent ports shown in FIGS. 1-6. The vacuum port 121 and the vent ports 101-105 are line-symmetrically arranged inside the transfer chamber 20C with respect to the center line CL.

Figure 10:
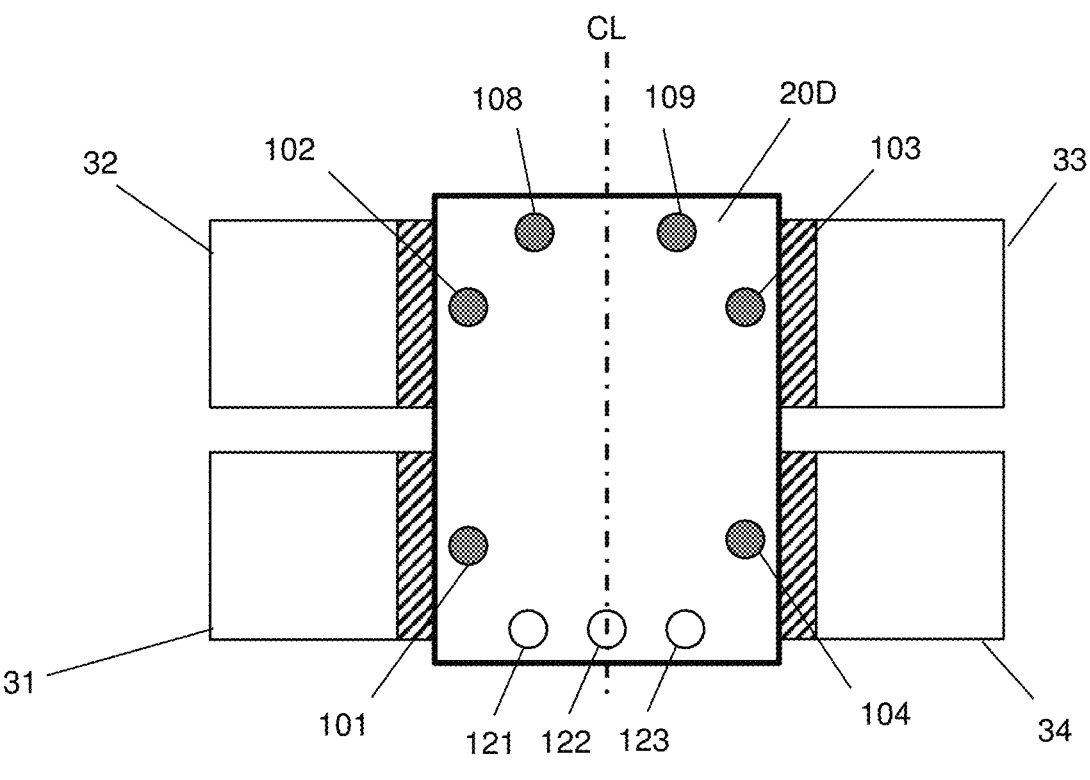
FIG. 10 is a schematic view of a vent/vacuum port arrangement according to another embodiment of the present disclosure.

FIG. 10 is a schematic view of a vent/vacuum port arrangement according to another embodiment of the present disclosure. In FIG. 10, similar to FIGS. 1-6, four vacuum processing or measurement chambers 31-34 are provided to the transfer chamber 20D. The transfer chamber 20D includes four vent ports for respective vacuum processing or measurement chambers 31-34 and two common vent ports 108 and 109 are provided as shown in FIG. 10. The vent ports 108-109 are line-symmetrically arranged inside the transfer chamber 20D with respect to the center line CL, and the vent ports 101-105 and 108-109 are also line-symmetrically arranged inside the transfer chamber 20D with respect to the center line CL. The vacuum ports 121-123 are line-symmetrically arranged inside the transfer chamber 20D with respect to the center line CL. In FIG. 10, the center line CL does not pass through any of the vent ports.

Figure 11:
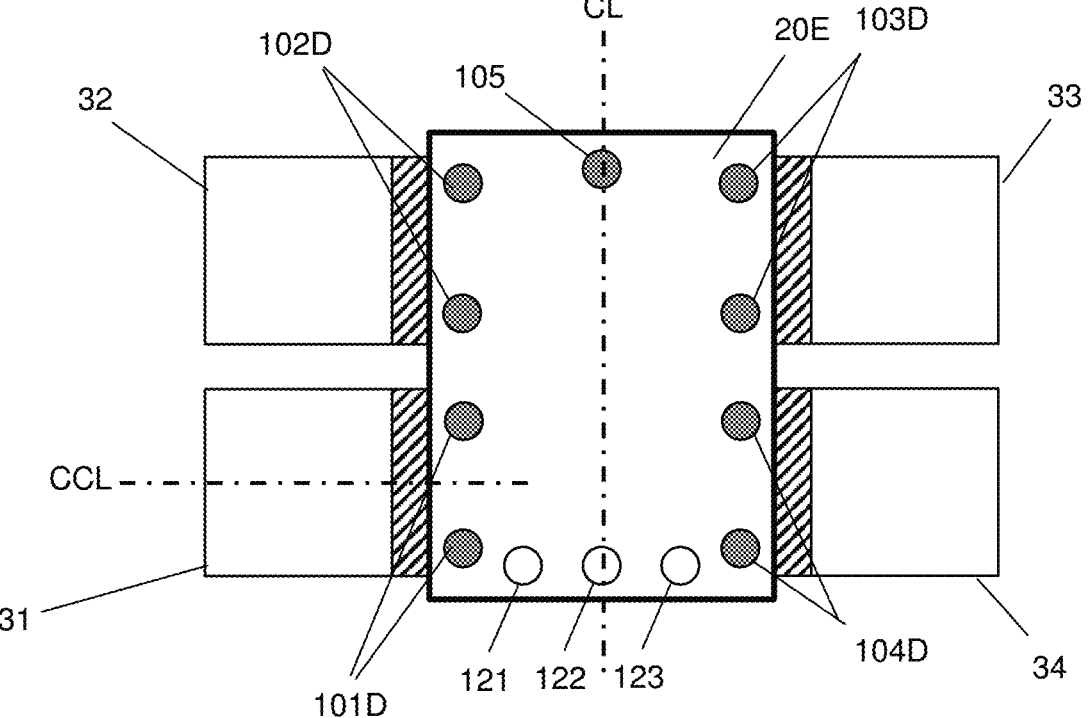
FIG. 11 is a schematic view of a vent/vacuum port arrangement according to another embodiment of the present disclosure.

FIG. 11 is a schematic view of a vent/vacuum port arrangement according to another embodiment of the present disclosure. In FIG. 11, similar to FIGS. 1-6, four vacuum processing or measurement chambers 31-34 are provided to the transfer chamber 20E. In the embodiments of FIG. 11, a set of two or more vent ports are provided respectively for the corresponding vacuum processing or measurement chambers 31-34, respectively. For example, a set of vent ports 101D is provided in front of the vacuum processing or measurement chamber 31, a set of vent ports 102D is provided in front of the vacuum processing or measurement chamber 32, a set of vent ports 103D is provided in front of the vacuum processing or measurement chamber 33, and a set of vent ports 104D is provided in front of the vacuum processing or measurement chamber 34, respectively. When the size of a semiconductor wafer is large (e.g., 12 inches) or a large glass substrate for a flat display panel is used, the size, in particular the width, of the vacuum processing or measurement chambers also becomes large. Providing a set of vent ports is advantageous for such large vacuum processing or measurement chamber. Further, in some embodiments, as shown in FIG. 11, the vent ports of the set of vent ports (e.g., 101D) are line-symmetrically arranged with respect to the center line CCL of the corresponding vacuum processing or measurement chamber 31.

Figure 12:
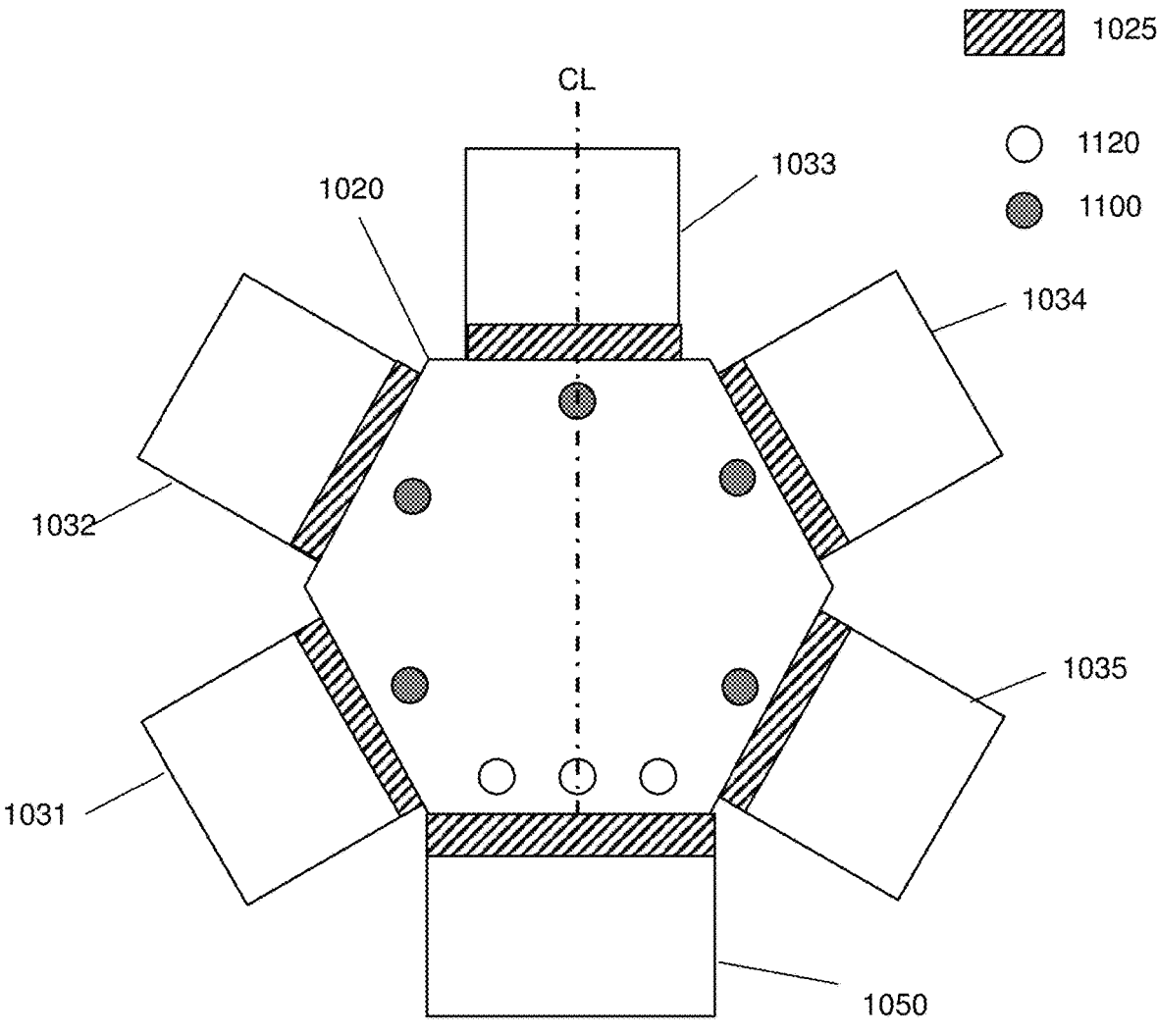
FIG. 12 is a schematic view of a vacuum processing apparatus according to an embodiment of the present disclosure.

FIG. 12 is a schematic view of a vent/vacuum port arrangement according to another embodiment of the present disclosure. In this embodiment, the shape of the transfer chamber 1020 is hexagonal having six side walls. One or more load lock chambers 1050 are provided to one of the six side walls via a gate valve 1025, and five vacuum processing or measurement chambers 1031, 1032, 1033, 1034 and 1035 are connected to the transfer chamber 1020 via gate valves 1025, respectively. In some embodiments, three vacuum ports 1120 are provided in fro of the load lock chamber 1050, and vent ports 1100 are provided respectively to the corresponding vacuum processing or measurement chambers 1031-1035. As shown in FIG. 12, the vent ports 1110 and the vacuum ports 1120 are line-symmetrically arranged with respect to the center line CL of the transfer chamber 1020. In some embodiments, no common vent port is provided in the transfer chamber 1020. In other embodiments, one or more common vent ports are provided line-symmetrically with respect to the center line CL.

In a purge operation inside the transfer chamber 1020 in the idle condition, the vent port 1100 located in front of the vacuum processing or measurement chamber 1033 functions as a common vent port similar to the common vent port 105 shown in FIG. 4, in some embodiments. In other embodiments, vent ports in front of the vacuum processing or measurement chambers 1032 and 1034 function as common vent ports similar to the common vent port 105 shown in FIG. 4.

Figure 13:
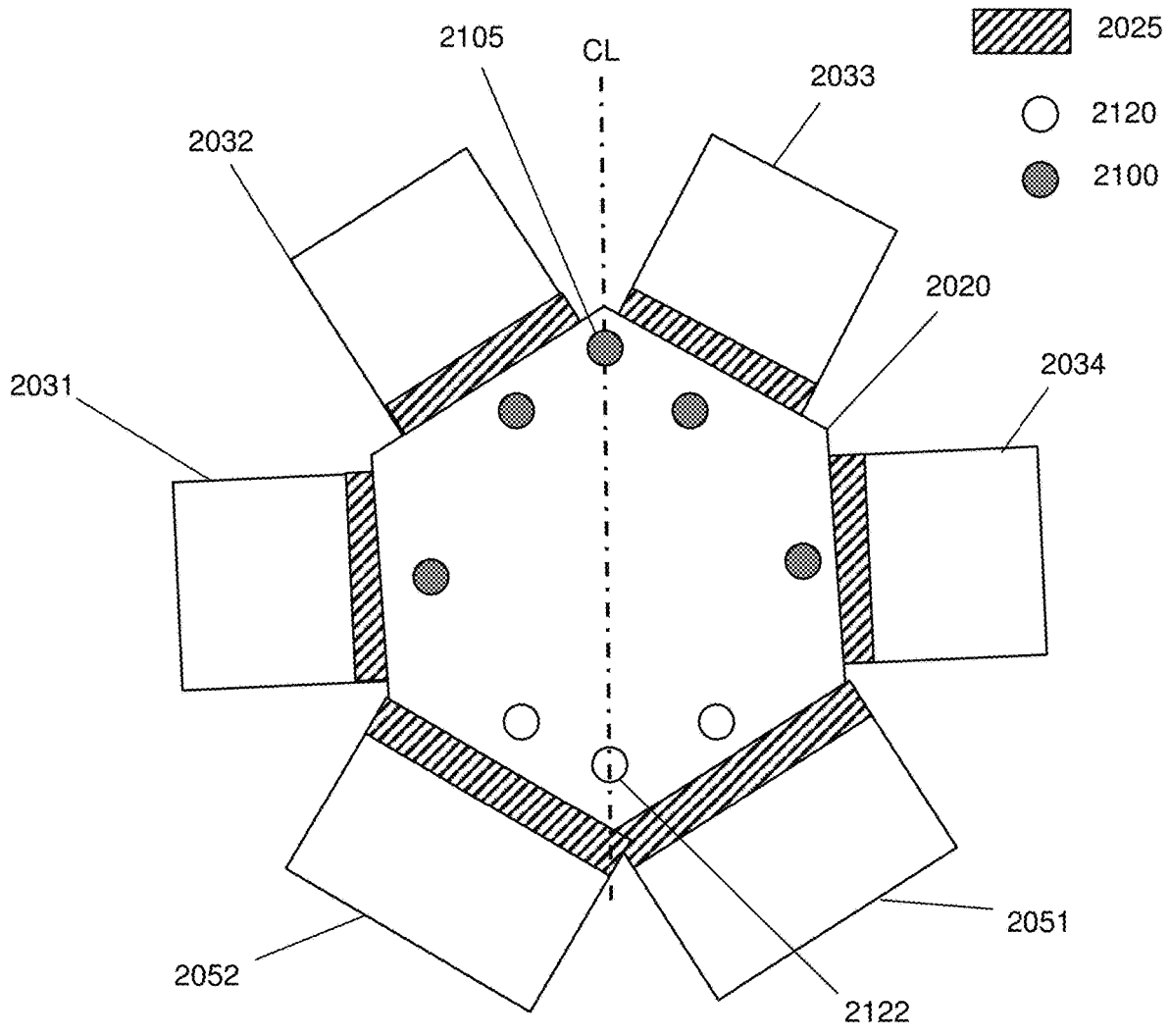
FIG. 13 is a schematic view of a vacuum processing apparatus according to an embodiment of the present disclosure.

FIG. 13 is a schematic view of a vent/vacuum port arrangement according to another embodiment of the present disclosure. In this embodiment, the shape of the transfer chamber 2020 is hexagonal having six side walls. Two load lock chambers 2051, 2052 are provided to two of the six side walls via gate valves 2025, and four vacuum processing or measurement chambers 2031, 2032, 2033 and 2034 are connected to the transfer chamber 2020 via gate valves 2025, respectively. In some embodiments, a common vent port 2105 is provided. The common vent port 2015 is not provided in other embodiments, and in such a case, the vent ports provided in front of the vacuum processing or measurement chambers 2032 and 2033 functions as a common vent port shown in FIG. 4. The vent ports 2100 are provided respectively to the corresponding vacuum processing or measurement chambers 2031-2034. Further, the vacuum ports 2120 are provided respectively to the corresponding load lock chambers 2050. Further, in some embodiments, a common vacuum port 2122 is provided between the load lock chambers 2050.

As shown in FIG. 13, the vent ports 2100 and 2105 and the vacuum ports 2120 and 2122 are line-symmetrically arranged with respect to the center line CL of the transfer chamber 2020.

Figure 14:
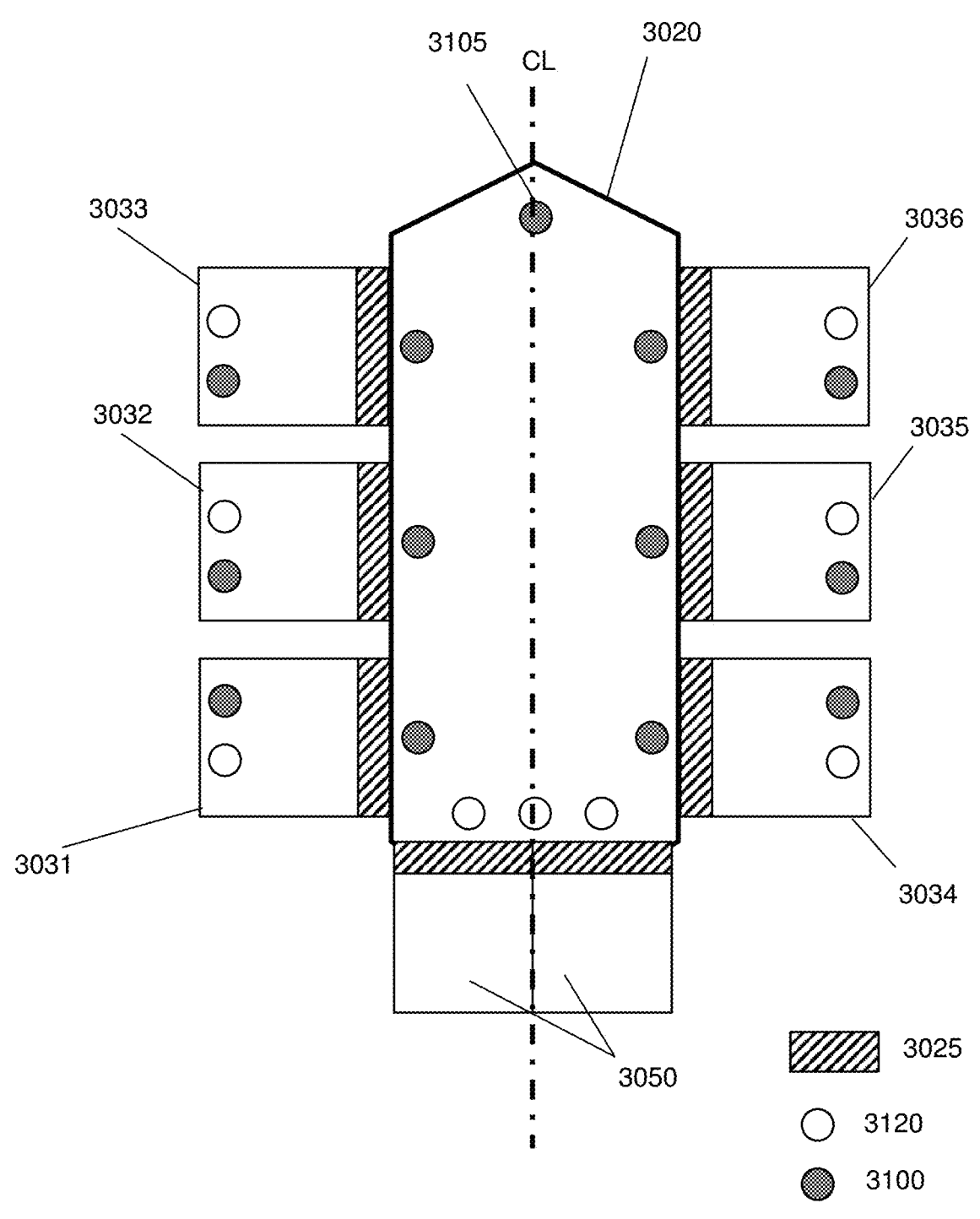
FIG. 14 is a schematic view of a vacuum processing apparatus according to an embodiment of the present disclosure.

FIG. 14 is a schematic view of a vent/vacuum port arrangement according to another embodiment of the present disclosure. In this embodiment, the shape of the transfer chamber 3020 is elongated pentagonal having five side walls. As shown in FIG. 14, six (6) vacuum processing or measurement chambers 3031-3036 are connected via gate valves 3025, respectively, to a transfer chamber 3020. Two load lock chambers 3050 are provided to one of the side walls of the transfer chamber 3020. The vent ports 3100 are provided respectively in front of the corresponding vacuum processing or measurement chambers 3031-3036, and a common vent port 3105 is also provided. Three vacuum ports 3120 are provided in front of the load lock chambers 3050. The vent ports 3100 and 3105 and the vacuum ports 3120 are line-symmetrically arranged inside the transfer chamber 3020 with respect to the center line CL.

Figure 15:
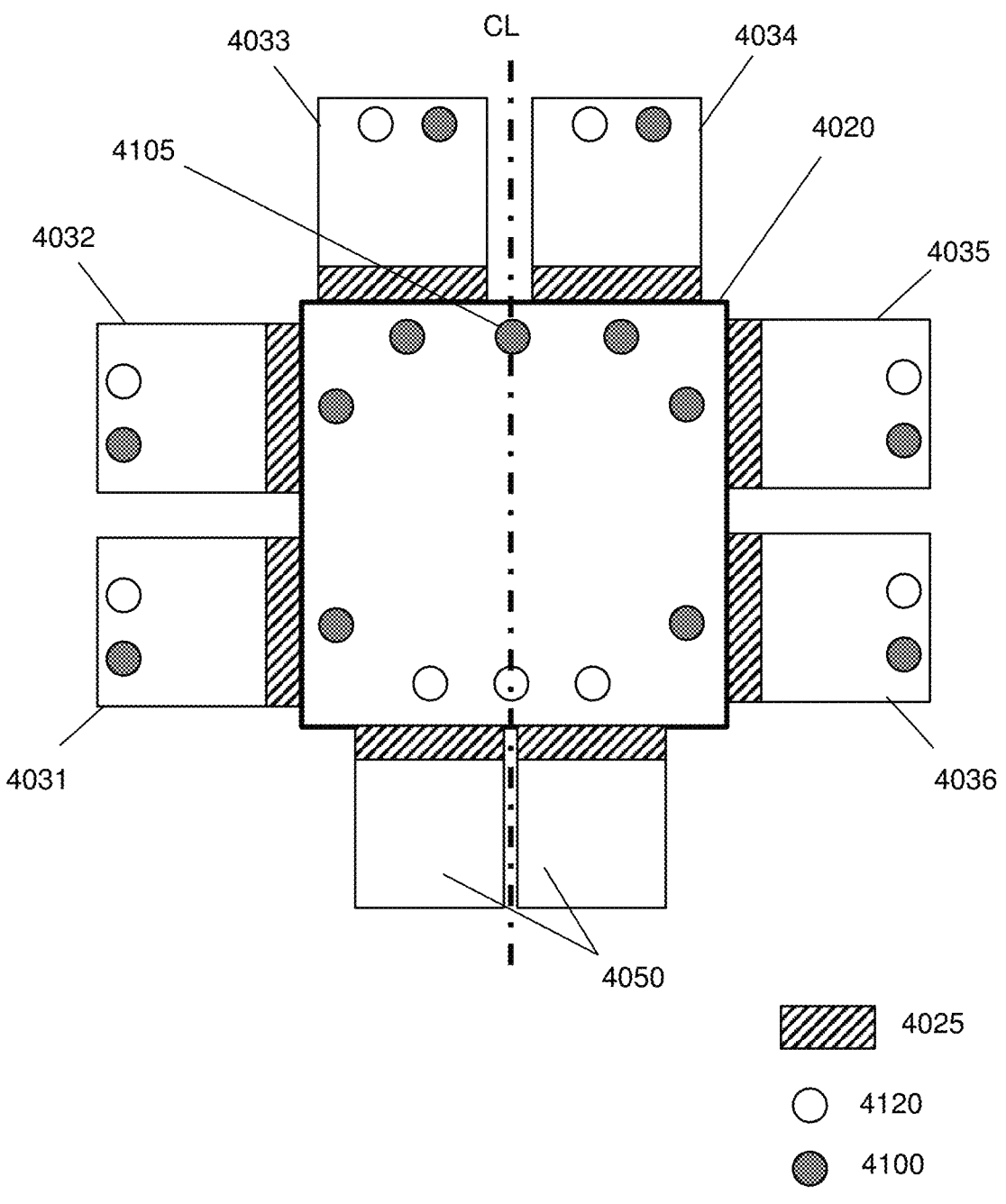
FIG. 15 is a schematic view of a vacuum processing apparatus according to an embodiment of the present disclosure.

FIG. 15 is a schematic view of a vent/vacuum port arrangement according to another embodiment of the present disclosure. In this embodiment, the shape of the transfer chamber 4020 is a rectangular or a square. Six vacuum processing or measurement chambers 4031, 4032, 4033, 4034, 4035 and 4036 are provided. Two of the vacuum processing or measurement chambers are respectively connected to each of three side walls of the transfer chamber 4020, and two load lock chambers 4050 are connected to the remaining side wall of the transfer chamber 4020. The vent ports 4100 are provided respectively in front of the corresponding vacuum processing or measurement chambers 4031-4036, and a common vent port 4105 is also provided. In some embodiments, the common port 4105 is not provided. Three vacuum ports 4120 are provided in front of the load lock chambers 4050. The vent ports 4100 and 4105 and the vacuum ports 4120 are line-symmetrically arranged inside the transfer chamber 4020 with respect to the center line CL.

Figure 16:
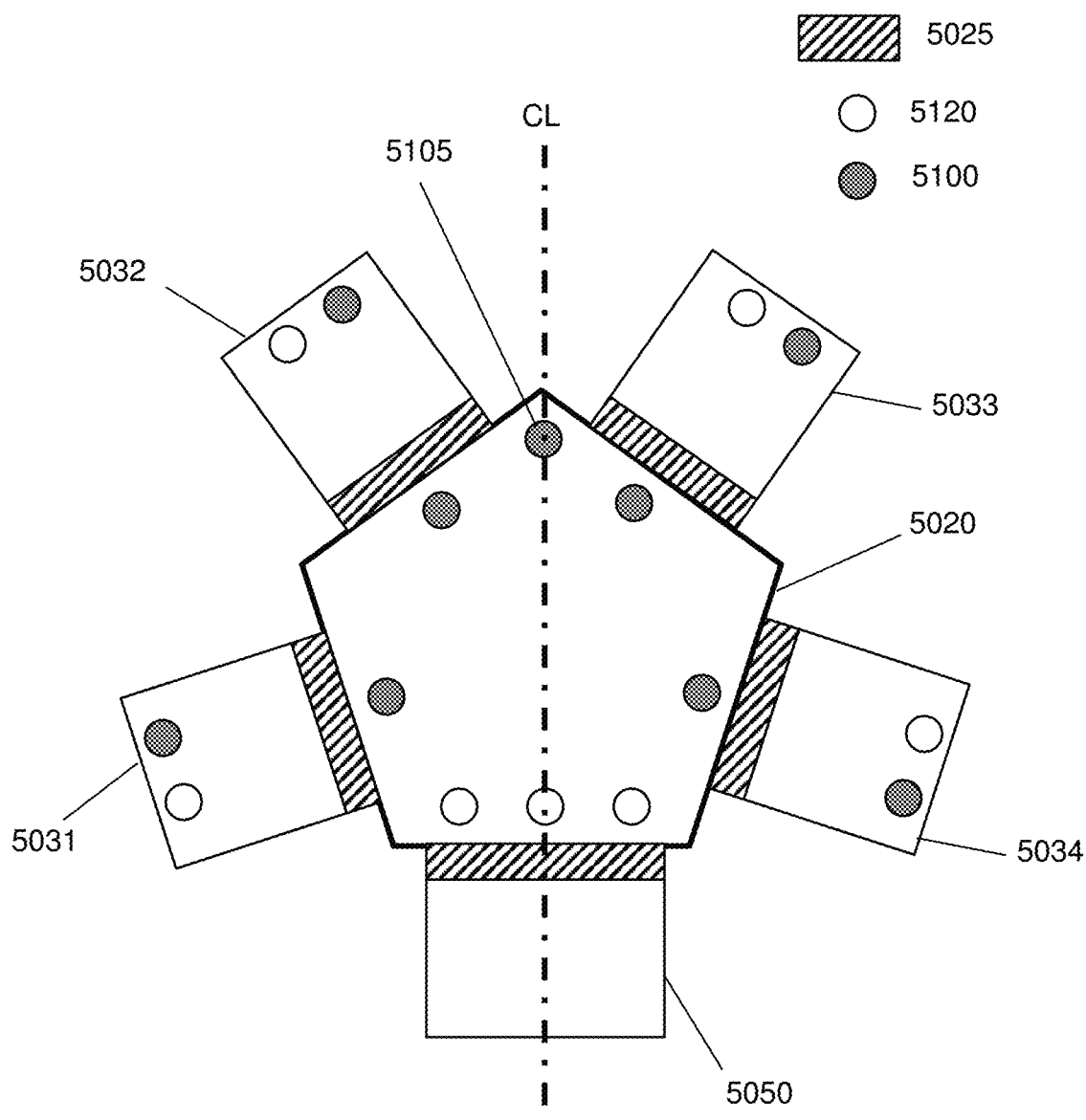
FIG. 16 is a schematic view of a vacuum processing apparatus according to an embodiment of the present disclosure.

FIG. 16 is a schematic view of a vent/vacuum port arrangement according to another embodiment of the present disclosure. In this embodiment, the shape of the transfer chamber 5020 is pentagonal having five side walls. As shown in FIG. 15, four vacuum processing or measurement chambers 5031-5034 are connected via gate valves 5025, respectively, to a transfer chamber 5020. One or more load lock chambers 5050 are provided to one of the side walls of the transfer chamber 5020. The vent ports 5100 are provided respectively in front of the corresponding vacuum processing or measurement chambers 5031-5034, and a common vent port 5105 is also provided. In other embodiments, no common vent port is provided. Three vacuum ports 5120 are provided in front of the load lock chamber 5050. The vent ports 5100 and 5105 and the vacuum ports 5120 are line-symmetrically arranged inside the transfer chamber 3020 with respect to the center line CL.

FIGS. 17-20 are schematic views of a gas supply/vacuum port arrangement inside a vacuum processing or measurement chamber according to an embodiment of the present disclosure.

In the foregoing embodiments, symmetric port arrangements inside a transfer chamber are explained. However, a symmetric port arrangement is not limited to the transfer chamber, but can be applied to any other vacuum chamber having one or more gas supply ports and one or more vacuum ports. One or more features of two or more following embodiments can be combined with one or more following embodiments. Configurations, element, features, materials and/or dimensions the same as or similar to those for FIGS. 1-16 may be employed in the following embodiments, and the detailed explanations may be omitted. Further, one or more features of the forgoing embodiments can be combined with one or more following embodiments.

Figures 17, 18, 19, 20:
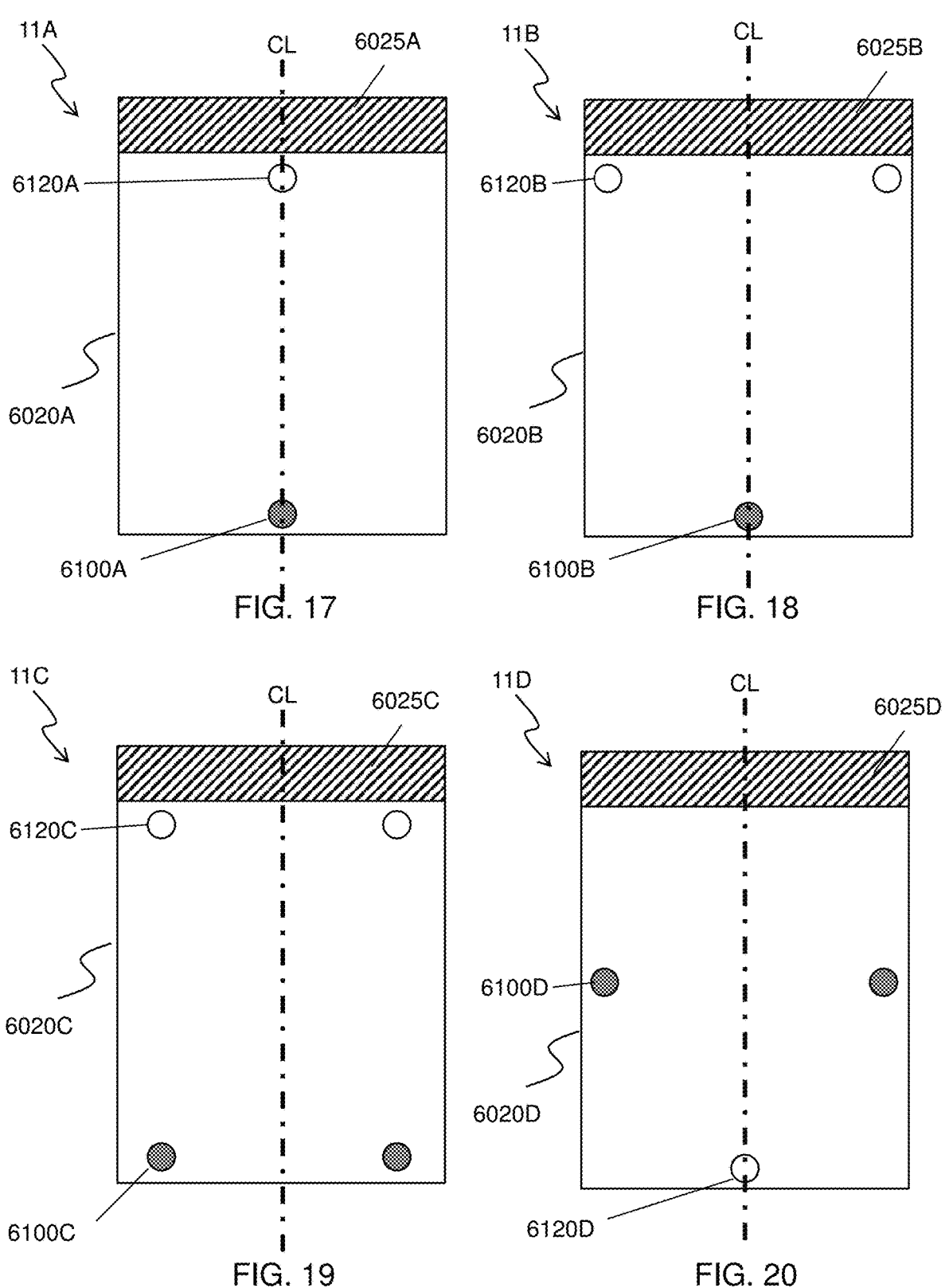
FIG. 17 is a schematic view of a vent/vacuum port arrangement according to another embodiment of the present disclosure.
FIG. 18 is a schematic view of a vent/vacuum port arrangement according to another embodiment of the present disclosure.
FIG. 19 is a schematic view of a vent/vacuum port arrangement according to another embodiment of the present disclosure.
FIG. 20 is a schematic view of a vent/vacuum port arrangement according to another embodiment of the present disclosure.

FIG. 17 is a schematic view of a gas supply/vacuum port arrangement according to an embodiment of the present disclosure. As shown in FIG. 17, a vacuum chamber 11A includes a chamber body 6020A and a gate valve 6025A. The chamber body 6020A includes at least one gas supply port and at least one vacuum port. In some embodiments, one gas supply port 6100A and one vacuum port 6120A are provided on the center line CL of the chamber body 6020A. According to the port arrangement of FIG. 17, in, for example a purge operation, gas flows from the gas supply port 6100A to the vacuum port 6120A are symmetric with respect to the center line CL, thereby minimizing generation of a dead space. In some embodiments, the gas supply port 6100A is located close to the gate valve 6025A and the vacuum port 6120A are located to the opposite side of the chamber body 6020A, and in other embodiments, the vacuum port 6120A are located close to the gate valve 6025A and the gas supply port 6100A is located to the opposite side of the chamber body 6020A.

FIG. 18 is a schematic view of a gas supply/vacuum port arrangement according to another embodiment of the present disclosure. As shown in FIG. 18, a vacuum chamber 11B includes a chamber body 6020B and a gate valve 6025B. The chamber body 6020B includes at least one gas supply port and at least one vacuum port. In some embodiments, one gas supply port 6100B and two vacuum ports 6120B are provided line-symmetrically with respect to the center line CL of the chamber body 6020B. According to the port arrangement of FIG. 18, in, for example a purge operation, gas flows from the gas supply port 6100B to the vacuum ports 6120B are symmetric with respect to the center line CL, thereby minimizing generation of a dead space. In some embodiments, the gas supply port 6100B is located close to the gate valve 6025B and the vacuum ports 6120B are located to the opposite side of the chamber body 6020B, and in other embodiments, the vacuum ports 6120B are located close to the gate valve 6025B and the gas supply port 6100B is located to the opposite side of the chamber body 6020B.

FIG. 19 is a schematic view of a gas supply/vacuum port arrangement according to another embodiment of the present disclosure. As shown in FIG. 19, a vacuum chamber 11C includes a chamber body 6020C and a gate valve 6025C. The chamber body 6020C includes at least one gas supply port and at least one vacuum port. In some embodiments, two gas supply ports 6100C and two vacuum ports 6120C are provided line-symmetrically with respect to the center line CL of the chamber body 6020C. According to the port arrangement of FIG. 19, in, for example a purge operation, gas flows from the gas supply ports 6100C to the vacuum ports 6120C are symmetric with respect to the center line CL, thereby minimizing generation of a dead space. In some embodiments, the gas supply ports 6100C are located close to the gate valve 6025C and the vacuum ports 6120C are located to the opposite side of the chamber body 6020C, and in other embodiments, the vacuum ports 6120C are located close to the gate valve 6025C and the gas supply ports 6100C are located to the opposite side of the chamber body 6020C.

FIG. 20 is a schematic view of a gas supply/vacuum port arrangement according to another embodiment of the present disclosure. As shown in FIG. 20, a vacuum chamber 11D includes a chamber body 6020D and a gate valve 6025D. The chamber body 6020D includes at least one gas supply port and at least one vacuum port. In some embodiments, two gas supply ports 6100D and one vacuum port 6120D are provided line-symmetrically with respect to the center line CL of the chamber body 6020D. According to the port arrangement of FIG. 20, in, for example a purge operation, gas flows from the gas supply ports 6100D to the vacuum port 6120D are symmetric with respect to the center line CL, thereby minimizing generation of a dead space. In some embodiments, the gas supply ports 6100D are located at the middle of the chamber body 6020D and the vacuum port 6120D are located to the end side of the chamber body 6020D opposite to the gate valve 6025D. In other embodiments, two vacuum ports 6120D are located at the middle of the chamber body 6020D and one gas supply port 6100D is located to the end side of the chamber body 6020D.

It will be understood that not all advantages have been necessarily discussed herein, no particular advantage is required for all embodiments or examples, and other embodiments or examples may offer different advantages.

In accordance with an aspect of the present disclosure, a vacuum apparatus includes process chambers, and a transfer chamber coupled to the process chambers. The transfer chamber includes one or more vacuum ports, through which a gas inside the transfer chamber is exhausted, and vent ports, from which a vent gas is supplied. The one or more vacuum ports and the vent ports are arranged such that air flows from at least one of the vent ports to the one or more vacuum ports are line-symmetric with respect to a center line of the transfer chamber. In one or more of the foregoing and following embodiments, the vent ports are line-symmetrically arranged with respect to the center line of the transfer chamber. In one or more of the foregoing and following embodiments, at least one vent port is provided in the transfer chamber in front of each of the process chambers. In one or more of the foregoing and following embodiments, at least one common vent port is provided on the center line of the transfer chamber. In one or more of the foregoing and following embodiments, two or more vacuum ports are provided in the transfer chamber. In one or more of the foregoing and following embodiments, the two or more vacuum ports are line-symmetrically arranged with respect to the center line of the transfer chamber. In one or more of the foregoing and following embodiments, at least one of the two or more vacuum ports is provided on the center line of the transfer chamber. In one or more of the foregoing and following embodiments, the vacuum apparatus further includes a load lock chamber connected to the transfer chamber. In one or more of the foregoing and following embodiments, at least one of the one or more vacuum ports is provided in the transfer chamber in front of the load lock chamber, and is located closer to the load lock chamber than the vent ports. In one or more of the foregoing and following embodiments, a gate valve is provided between the transfer chamber and each of the process chambers.

According to another aspect of the present disclosure, a vacuum apparatus includes process chambers, a transfer chamber coupled to the process chambers, gate valves provided between the transfer chamber and the process chambers, respectively, a pump system, a gas supply, one or more vacuum ports disposed inside the transfer chamber and connected to the pump system via one or more vacuum valves, respectively, vent ports disposed inside the transfer chamber and connected to the gas supply via vent valves, respectively, and a controller for controlling at least the one or more vacuum valves and the vent valves. The vent ports are line-symmetrically arranged with respect to a center line of the transfer chamber. The center line is a line passing through a geometric center of the transfer chamber and is perpendicular to one side wall or one corner of the transfer chamber in plan view. In one or more of the foregoing and following embodiments, when all the gate valves are closed, the controller opens at least one vacuum valve and at least one vent valve such that air flows from at least one vent port to at least one vacuum port are line-symmetric with respect to a center line of the transfer chamber. In one or more of the foregoing and following embodiments, at least one vent port is provided in the transfer chamber in front of each of the process chambers. In one or more of the foregoing and following embodiments, when one of the gate valves corresponding to one of the process chambers is opened, the controller opens one of the vent valves corresponding to one of the vent ports in front of corresponding one of the process chambers. In one or more of the foregoing and following embodiments, wherein, when the one of the vent valve opened, the controller does not open remaining vent valves. In one or more of the foregoing and following embodiments, at least one common vent port is provided on the center line of the transfer chamber. In one or more of the foregoing and following embodiments, when all the gate valves are closed, the controller opens at least one vent valve for the at least one common vent port and opens the one or more vacuum valves.

In accordance with another aspect of the present disclosure, a vacuum apparatus for processing a semiconductor wafer includes process chambers including at least one selected from the group consisting of a plasma etching chamber and a film deposition chamber, a transfer chamber coupled to the process chambers, and a wafer handler disposed inside the transfer chamber. The transfer chamber includes one or more vacuum ports, through which a gas inside the transfer chamber is exhausted, and vent ports, from which a vent gas is supplied. The vent ports are line-symmetrically arranged with respect to a center line of the transfer chamber. The center line is a line passing through a geometric center of the transfer chamber and is perpendicular to one side wall or one corner of the transfer chamber in plan view. In one or more of the foregoing and following embodiments, the vacuum apparatus further includes a load lock chamber. The one or more vacuum ports are provided in the transfer chamber in front of the load lock chamber, and are located closer to the load lock chamber than the vent ports. In one or more of the foregoing and following embodiments, two or more vacuum ports are provided inside the transfer chamber, and are arranged on a line parallel to one of side walls of the transfer chamber.

In accordance with another aspect of the present disclosure, a method is for operating a vacuum apparatus. The vacuum apparatus includes process chambers, a transfer chamber coupled to the process chambers, gate valves provided between the transfer chamber and the process chambers, respectively, a pump system, a gas supply, one or more vacuum ports disposed inside the transfer chamber and connected to the pump system via one or more vacuum valves, respectively, and vent ports disposed inside the transfer chamber and connected to the gas supply via vent valves, respectively. At least one vent port is provided in front of each of the process chambers. In the method, when moving a wafer from the transfer chamber to one of the process chamber or from one of the process chamber to the transfer chamber, one of the gate valves corresponding to the one of the process chambers is opened. One of the vent valve corresponding to one of the vent ports in front of the one of the process chambers is opened.

In accordance with another aspect of the present disclosure, a method is for operating a vacuum apparatus. The vacuum apparatus includes process chambers, a transfer chamber coupled to the process chambers, gate valves provided between the transfer chamber and the process chambers, respectively, a pump system, a gas supply, one or more vacuum ports disposed inside the transfer chamber and connected to the pump system via one or more vacuum valves, respectively, and vent ports disposed inside the transfer chamber and connected to the gas supply via vent valves, respectively. In the method, when all the gate valves are closed, at least one vacuum valve and at least one vent valve are opened such that air flows from at least one vent port to at least one vacuum port are line-symmetric with respect to a center line of the transfer chamber. In one or more of the foregoing and following embodiments, only one vent valve is opened while remaining vent valves are closed such that the air flows from only one vent port to at least one vacuum port are line-symmetric with respect to the center line of the transfer chamber. In one or more of the foregoing and following embodiments, two or more vacuum ports and two or more vacuum valves are provided, and two or more vacuum ports are opened such that air flows from at least one vent port to the two or more vacuum ports are line-symmetric with respect to the center line of the transfer chamber.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for operating a vacuum apparatus, the vacuum apparatus including:
   process chambers;
   a transfer chamber coupled to the process chambers;
   gate valves provided between the transfer chamber and the process chambers, respectively;
   a pump system;
   a gas supply;
   one or more vacuum ports disposed inside the transfer chamber and connected to the pump system via one or more vacuum valves, respectively;
   vent ports disposed inside the transfer chamber and connected to the gas supply via vent valves respectively; and
   a controller, the method comprising controlling, by the controller, opening at least one vacuum valve of the one or more vacuum valves and at least one vent valve of the vent valves such that air flows from at least one vent port of the vent ports to at least one vacuum port of the one or more vacuum ports are line-symmetric with respect to a center line of the transfer chamber.

2. The method of claim 1, wherein only one vent valve of the vent valves is opened while remaining vent valves of the vent valves are closed such that the air flows from only one vent port of the vent ports to at least one vacuum port of the one or more vacuum ports are line-symmetric with respect to the center line of the transfer chamber.

3. The method of claim 1, wherein:

two or more vacuum ports and two or more vacuum valves are provided, and the controller controls opening of the two or more vacuum ports such that air flows from at least one vent port of the vent ports to the two or more vacuum ports are line-symmetric with respect to the center line of the transfer chamber.

4. The method of claim 1, wherein the vent ports are line-symmetrically arranged with respect to the center line of the transfer chamber.

5. The method of claim 1, wherein at least one common vent port of the vent ports is provided in front of a sidewall of the transfer chamber where no process chamber is provided and is a closest vent port to the sidewall of the transfer chamber where no process chamber is provided among the vent ports.

6. The method of claim 1, wherein the vent ports comprise at least one common vent port provided on the center line of the transfer chamber.

7. The method of claim 1, wherein the vacuum apparatus further comprises a load lock chamber, and the one or more vacuum ports in the transfer chamber include three vacuum ports arranged closer to the load lock chamber than any of the vent ports.

8. The method of claim 7, wherein the three vacuum ports are line-symmetrically arranged with respect to the center line of the transfer chamber.

9. The method of claim 7, wherein at least one vacuum port of the three vacuum ports is provided on the center line of the transfer chamber.

10. A method, comprising:

closing all gate valves of a plurality of gate valves between a plurality of processing chambers and a transfer chamber of a vacuum processing apparatus;

opening at least one vent port of a plurality of vent ports and at least one vacuum port disposed in the transfer chamber;

purging the transfer chamber using a first vent gas introduced into the transfer chamber through the at least one opened vent port of the plurality of vent ports, wherein during the purging, gas flows from the at least one opened vent port of the plurality of vent ports to the at least one opened vacuum port are line-symmetric with respect to a center line of the transfer chamber;

transferring a substrate from a load lock chamber to the transfer chamber;

opening a first vent port of the plurality of vent ports adjacent a first gate valve of the plurality of gate valves between a first processing chamber of the plurality of processing chambers and the transfer chamber;

opening the first gate valve of the plurality of gate valves;

purging the first processing chamber of the plurality of processing chambers using a second vent gas introduced into the first processing chamber of the plurality of processing chambers through the first vent port of the plurality of vent ports; and transferring the substrate from the transfer chamber to the first processing chamber of the plurality of processing chambers, wherein the closing all the gate valves of the plurality of gate valves, the opening the at least one vent port of the plurality of vent ports, the opening the at least one vacuum port, the purging the transfer chamber, the transferring the substrate from the load lock chamber to the transfer chamber, the opening the first vent port of the plurality of vent ports, the opening the first gate valve of the plurality of gate valves, the purging the first processing chamber of the plurality of processing chambers, and the transferring the substrate from the transfer chamber to the first processing chamber of the plurality of processing chambers are controlled by a controller.

11. The method of claim 10, wherein one vent port of the plurality of vent ports is disposed adjacent to each gate valve of the plurality of gate valves between the transfer chamber and each processing chamber of the plurality of processing chambers.

12. The method of claim 10, wherein one vent port of the plurality of vent ports is disposed on the center line of the transfer chamber.

13. The method of claim 10, wherein the at least one vacuum port includes three vacuum ports line-symmetrically arranged with respect to the center line of the transfer chamber.

14. A method, comprising:

closing all gate valves of a plurality of gate valves between a plurality of processing chambers and a transfer chamber of a vacuum processing apparatus;

opening at least one vent port of a plurality of vent ports and at least one vacuum port disposed in the transfer chamber, wherein the at least one opened vent port of the plurality of vent ports is line-symmetrically arranged with respect to a center line of the transfer chamber, and the at least one vacuum port is line-symmetrically arranged with respect to the center line of the transfer chamber;

purging the transfer chamber by flowing a first vent gas from the at least one opened vent port of the plurality of vent ports to the at least one vacuum port;

transferring a substrate from a load lock chamber to the transfer chamber;

opening a first vent port of the plurality of vent ports adjacent a first gate valve of the plurality of gate valves between a first processing chamber of the plurality of processing chambers and the transfer chamber;

opening the first gate valve of the plurality of gate valves;

purging the first processing chamber of the plurality of processing chambers using a second vent gas introduced into the first processing chamber of the plurality of processing chambers through the first vent port of the plurality of vent ports; and transferring the substrate from the transfer chamber to the first processing chamber of the plurality of processing chambers, wherein the closing all gate valves of the plurality of gate valves, the opening the at least one vent port of the plurality of vent ports, the opening the at least one vacuum port, the purging the transfer chamber, the transferring the substrate from the load lock chamber to the transfer chamber, the opening the first vent port of the plurality of vent ports, the opening the first gate valve of the plurality of gate valves, the purging the first processing chamber of the plurality of processing chambers, and the transferring the substrate from the transfer chamber to the first processing chamber of the plurality of processing chambers are controlled by a controller.

15. The method of claim 14, wherein one vent port of the plurality of vent ports is disposed adjacent to each gate valve of the plurality of gate valves between the transfer chamber and each processing chamber of the plurality of processing chambers.

16. The method of claim 14, wherein one vent port of the plurality of vent ports is disposed on the center line of the transfer chamber.

17. The method of claim 14, wherein the at least one vacuum port includes three vacuum ports line-symmetrically arranged with respect to the center line of the transfer chamber.

18. The method of claim 14, wherein gas flows of the first vent gas are line-symmetric with respect to the center line of the transfer chamber.

19. The method of claim 14, further comprising:
   providing a process gas to the first processing chamber of the plurality of processing chambers through at least one process gas port arranged in the first processing chamber of the plurality of processing chambers.

20. The method of claim 14, wherein one vent port of the plurality of vent ports is arranged in front of the load lock chamber.

* * * * *